(12) United States Patent
Yu

(10) Patent No.: US 6,184,097 B1
(45) Date of Patent: *Feb. 6, 2001

(54) PROCESS FOR FORMING ULTRA-SHALLOW SOURCE/DRAIN EXTENSIONS

(75) Inventor: Bin Yu, Santa Clara, CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/255,604

(22) Filed: Feb. 22, 1999

(51) Int. Cl.$^7$ .................................................. H01L 21/336
(52) U.S. Cl. ............................ 438/299; 438/303; 438/595
(58) Field of Search ...................... 438/299, 301, 438/303, 305, 306, 307, 595, 683

(56) References Cited

U.S. PATENT DOCUMENTS

| | | | |
|---|---|---|---|
| 4,727,038 | * 2/1988 | Watabe et al. | 438/304 |
| 4,745,082 | 5/1988 | Kwok . | |
| 4,784,718 | 11/1988 | Mitani et al. . | |
| 5,264,382 | 11/1993 | Watanabe . | |
| 5,374,575 | 12/1994 | Kim et al. . | |
| 5,391,510 | 2/1995 | Hsu et al. . | |
| 5,429,956 | 7/1995 | Shell et al. . | |
| 5,491,099 | * 2/1996 | Hsu | 438/302 |
| 5,593,907 | * 1/1997 | Anjum et al. | 438/302 |
| 5,595,919 | * 1/1997 | Pan | 438/305 |
| 5,675,159 | 10/1997 | Oku et al. . | |
| 5,716,861 | 2/1998 | Moslehi . | |
| 5,736,446 | * 4/1998 | Wu | 438/305 |
| 5,825,066 | * 10/1998 | Buynoski | 257/345 |
| 5,856,225 | 1/1999 | Lee et al. . | |
| 5,858,843 | 1/1999 | Doyle et al. . | |
| 5,915,182 | * 6/1999 | Wu | 438/305 |
| 5,915,196 | * 6/1999 | Mineji | 438/526 |
| 6,030,863 | * 2/2000 | Chang et al. | 438/229 |

FOREIGN PATENT DOCUMENTS

| | | |
|---|---|---|
| 3-248433 | 2/1990 | (JP) . |
| 4-123439 | 9/1990 | (JP) . |
| 5-160396 | 6/1993 | (JP) . |

OTHER PUBLICATIONS

International Electron Devices Meeting 1997, "Sub–100nm Gate Length Metal Gate NMOS Transistors Fabricated by a Replacement Gate Process" by Chatterjee, et al., p. 821–824.

"Ultra–Thin–Body Silicon–on–Insulator MOSFET's for Terabit–Scale Integration" by Yu, et al., p. 623–626.

* cited by examiner

Primary Examiner—Charles Bowers
Assistant Examiner—Jack Chen
(74) Attorney, Agent, or Firm—Foley & Lardner

(57) ABSTRACT

A method of fabricating an integrated circuit with ultra-shallow source and drain junctions utilizes a dummy or sacrificial gate spacer. Ions are implanted and dopants are provided through the openings associated with sacrificial spacers to form the source and drain extensions. The openings can be filled with an insulative layer. The process can be utilized for P-channel or N-channel metal oxide semiconductor field effect transistors (MOSFETS).

20 Claims, 3 Drawing Sheets

PROCESS FOR FORMING ULTRA-SHALLOW SOURCE/DRAIN EXTENSIONS

CROSS REFERENCE TO RELATED APPLICATIONS

This patent application is related to U.S. application ser. No. 09/187,630, filed on Nov. 6, 1998 by Yu, entitled "Dual Amorphization Implant Process for Ultra-Shallow Drain and Source Extensions", U.S. application ser. No. 09/187,890, filed on Nov. 6, 1998 by Yu, et al., entitled "A Method of Fabricating an Integrated Circuit with Ultra-Shallow Source/Drain Extension", and U.S. application ser. No. 09/187,172, filed on Nov. 6, 1998 by Yu, entitled "Recessed Channel Structure for Manufacturing Shallow Source Drain Extension", all assigned to the assignee of the present invention. This application is further related to U.S. application ser. No. 09/187,635 filed on Nov. 6, 1998 by Yu, et al., entitled "A Damascene Process for Forming Ultra-Shallow Source/Drain Extensions and Pocket in ULSI MOSFET."

FIELD OF THE INVENTION

The present invention relates to integrated circuits and methods of manufacturing integrated circuits. More particularly, the present invention relates to a method of manufacturing integrated circuits having transistors with ultra-shallow source and drain extensions.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed between drain and source regions. The drain and source regions are typically heavily doped with a P-type dopant (e.g., boron) or an N-type dopant (e.g., phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions and, hence, controlling short-channel effects, are particularly important as transistors become smaller.

Conventional techniques utilize a double implant process to form deeper source and drain regions and shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a thermal diffusion process or an ion implantation process. Without the sidewall spacers, the doping process introduces dopants into a thin region (i.e., just below the top surface of the substrate) to form the drain and source extensions, as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions, which are necessary for proper silicidation. The source and drain extensions are not further doped due to the blocking capability of the silicon dioxide spacer.

As transistors disposed on integrated circuits (ICs) become smaller, transistors with shallow and ultra-shallow source and drain extensions have become more difficult to manufacture. For example, smaller transistors should have ultra-shallow source and drain extensions with less than 30 nanometer (nm) junction depth. Forming source and drain extensions with junction depths of less than 30 nm is very difficult using conventional fabrication techniques. Conventional ion implantation and diffusion doping techniques are susceptible to channeling effects, which form a dopant profile tail distribution that extends deep into the substrate. Also, conventional ion implantation techniques have difficulty maintaining shallow source and drain extensions because point defects or crystal defects generated in the bulk semiconductor substrate during ion implantation can cause undesirable transient enhanced diffusion (TED) of the dopant during subsequent thermal processes. The diffusion often extends the source and drain extensions vertically into the bulk semiconductor substrate.

Thus, there is a need for a method of manufacturing ultra-shallow source and drain extensions that is not susceptible to transient enhanced diffusion. Further still, there is a need for transistors that have ultra-shallow junction source and drain extensions. Even further still, there is a need for an efficient method of manufacturing source and drain extensions.

SUMMARY OF THE INVENTION

The present invention relates to a method of manufacturing an integrated circuit. The method includes providing a gate structures, including a dummy spacer material from a portion of the substrate, removing the dummy spacer material, forming an amorphous region in the portion of the substrate, and providing dopants to the amorphous region to form an extension to a source or a drain. Removing the dummy spacer material leaves an opening. The amorphous region is formed in a substrate below the opening, and dopants are provided through the opening.

The present invention further relates to a method of manufacturing an ultra-large scale integrated circuit. The circuit includes a plurality of field effect transistors having shallow source and drain extensions. The method includes steps of removing a dummy spacer material from at least part of a gate structure on a top surface of a semiconductor substrate to form a first hole and a second hole, providing a semiconductor implant through the first hole and through the second hole, and providing a dopant implant through the first hole and through the second hole. The dummy spacer material is provided as part of the gate structure.

The present invention further relates to a process for forming shallow source extensions and shallow drain extensions in a semiconductor substrate. The process includes forming a plurality of gate structures on a top surface of the substrate, removing a pair of spacers from each of the gate structures, thereby exposing the top surface of the substrate, and providing a dopant through the exposed top surface of the substrate. The dopant creates the shallow source extension and the shallow drain extension.

BRIEF DESCRIPTION OF THE DRAWINGS

Exemplary embodiments of the present invention will hereafter be described with reference to he accompanying drawings, wherein like numerals denote like elements.

DETAILED DESCRIPTION OF THE PREFERRED EXEMPLARY EMBODIMENTS

Figure 1:
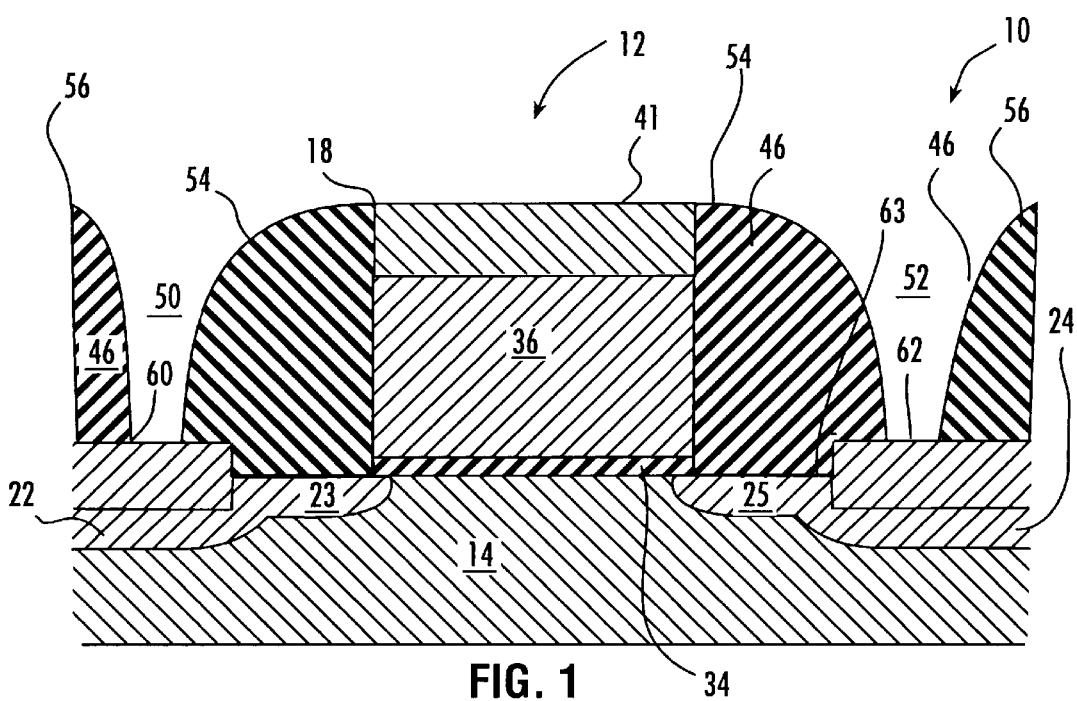
FIG. 1 is a cross-sectional view of a portion of an integrated circuit having a transistor with shallow source and drain extensions in accordance with an exemplary embodiment of the present invention.

With reference to FIG. 1, a transistor 12 is disposed on a semiconductor substrate 14, such as, a single crystal silicon wafer. Transistor 12 is part of a portion 10 of an integrated circuit (IC) manufactured on a wafer (such as, a silicon wafer). Alternatively, other types of substrates can be utilized, such as, silicon-on-insulator (SOI), gallium arsenide, germanium, or other semiconductor structures.

Transistor 12 is preferably an N-channel or a P-channel metal oxide semiconductor field effect transistor (MOSFET) that includes a gate stack or structure 18, a source region 22, and a drain region 24. Transistor 12 also includes a source extension 23 and a drain extension 25. Transistor 12 preferably has a gate length less than 100 nm.

Extensions 23 and 25 are preferably ultra-shallow extensions (e.g., junction depth is less than 30 nanometers (nm)), which are thinner than regions 22 and 24. Extensions 23 and 25 are connected to regions 22 and 24, respectively, and are disposed partially underneath gate stack 18. Ultra-shallow extensions 23 and 25 help transistor 12 achieve substantial immunity to short-channel effects. Short-channel effects can degrade the performance of transistor 12, as well as adversely affect the manufacturability of the IC associated with transistor 12. Regions 22 and 24 and extensions 23 and 25 have concentrations on the order of $10^{19}$ to $10^{20}$ dopants per cubic centimeter. The dopants can be boron, boron diflouride, indium, arsenic, phosphorous, antimony, or other impurity.

Most elements of transistor 12 can be manufactured according to conventional complementary metal oxide semiconductor (CMOS) process steps. Transistor 12 can be at least partially covered by an insulative layer 46 and is preferably part of an ultra-large scale integrated (ULSI) circuit that includes one million or more transistors. Vias or holes 50 and 52 divide layer 46 into spacer sections 54 and sections 56. Holes 50 and 52 allow electrical connections to be made to a silicide layer 60 above region 22 and a silicide layer 62 above region 24.

Layers 60 and 62 are 100–200 Å thick layers of $TiSi_2$, $NiSi_2$, $CoSi_2$, or other conductive material. Layers 60 and 62 extend 70% or 70 to 140 Å below a top surface 63 of substrate 14.

Gate structure 18 includes a silicide layer 41, a gate oxide 34, and a polysilicon gate conductor 36. Conductor 36 can be doped or undoped. Gate oxide 34 may alternatively be silicon nitride or silicon oxynitride. Conductor layer 36 can be a 1000–2000 Å thick layer, such as, silicon, germanium, a compound thereof, or a metal. Gate oxide 34 is preferably thermally grown on substrate 14 as silicon dioxide to a thickness of 20–50 Å. Conductor 36 is preferably deposited by chemical vapor deposition (CVD) and etched to form the particular structure for transistor 12. Layer 41 is similar to layers 60 and 62 (e.g., preferably 100–200 Å thick layer of $TiSi_2$, $NiSi_2$, $CoSi_2$, or other conductive material).

With reference to FIGS. 1–5, the fabrication of transistor 12, including source extension 23 and drain extension 25, is described below. The advantageous process allows source and drain extensions 23 and 25, respectively, to be annealed and activated separately from other implants, such as, N-wells, P-wells, and regions 22 and 24. Therefore, a very small thermal budget can be used to form extensions 23 and 25, which is advantageous for forming shallow junction depths.

Figure 2:
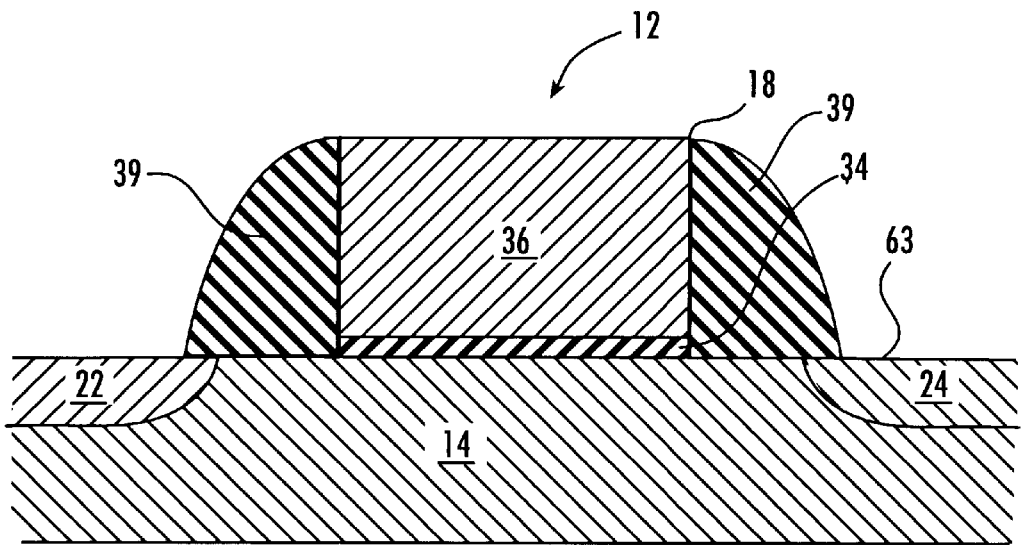
FIG. 2 is a cross-sectional view of the portion of the integrated circuit illustrated in FIG. 1, showing a gate structure with dummy spacer material.

In FIG. 2, transistor 12 can be substantially formed by conventional semiconductor processing techniques to form gate structure 18, including gate oxide 34, sacrificial or duming spacers 39, gate conductor 36, source region 22, and drain region 24. Spacers 39 are formed in a deposition and etch-back process. Preferably, spacers 39 are silicon nitride ($Si_3N_4$) deposited by plasma enhanced chemical vapor deposition (PECVD). Spacers 39 are 500–800 Å wide and 1000–2000 Å high. Alternatively, other spacer materials, such as, silicon dioxide ($SiO_2$), silicon oxynitride, or other insulators can be utilized.

Substrate 14 is doped in an ion-implantation process or diffusion process to form source region 22 and drain region 24. Regions 22 and 24 extend deeply below top surface 63 of substrate 14. Source region 22 and drain region 24 can be heavily doped with boron or phosphorous, depending upon the type of transistor 12. Alternatively, other dopants can be utilized. Substrate 14 is subjected to a rapid thermal-annealing (RTA) process to appropriately diffuse and activate dopants within substrate 14.

Figure 3:
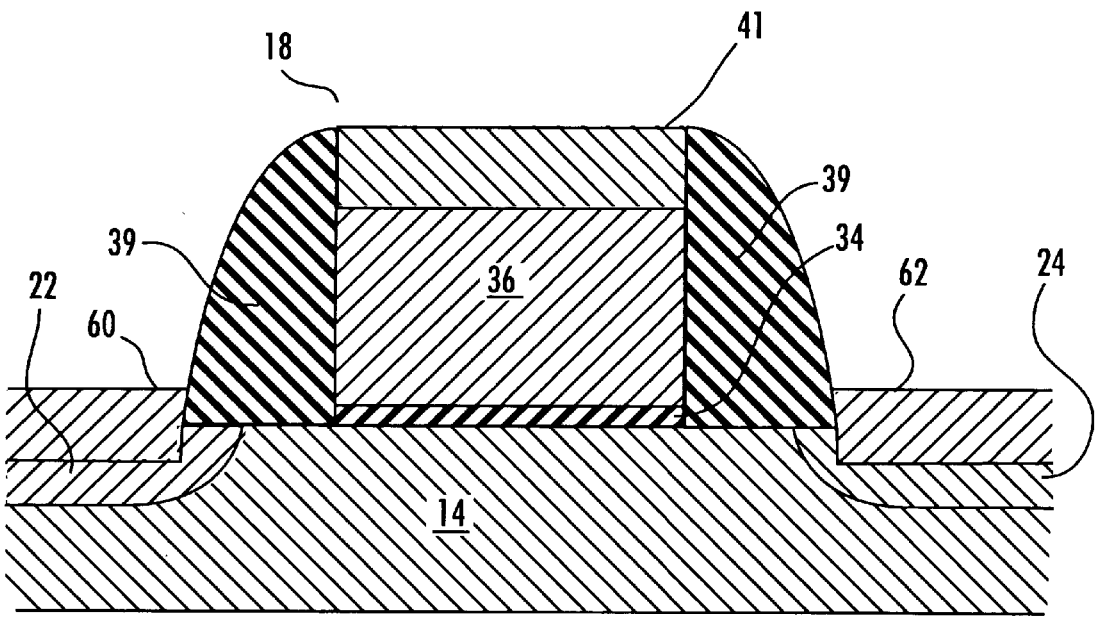
FIG. 3 is a cross-sectional view of the portion of the integrated circuit illustrated in FIG. 1, showing a silicidation step.

In FIG. 3, silicide layers 41, 60, and 62 are provided over substrate 14. Silicide layers 41, 60, and 62 can be formed in a conventional process, wherein a refractory metal (e.g., Co, Ti, Ni) is deposited by CVD and reacted with exposed surfaces of silicon associated with gate structure 36, region 22, and region 24. Atoms of the metal react with the exposed silicon (in a thermal process) to form silicide material. After the reaction, the unreacted metal material is removed. Layers 41, 60, and 62 reduce contact resistance.

Figure 4:
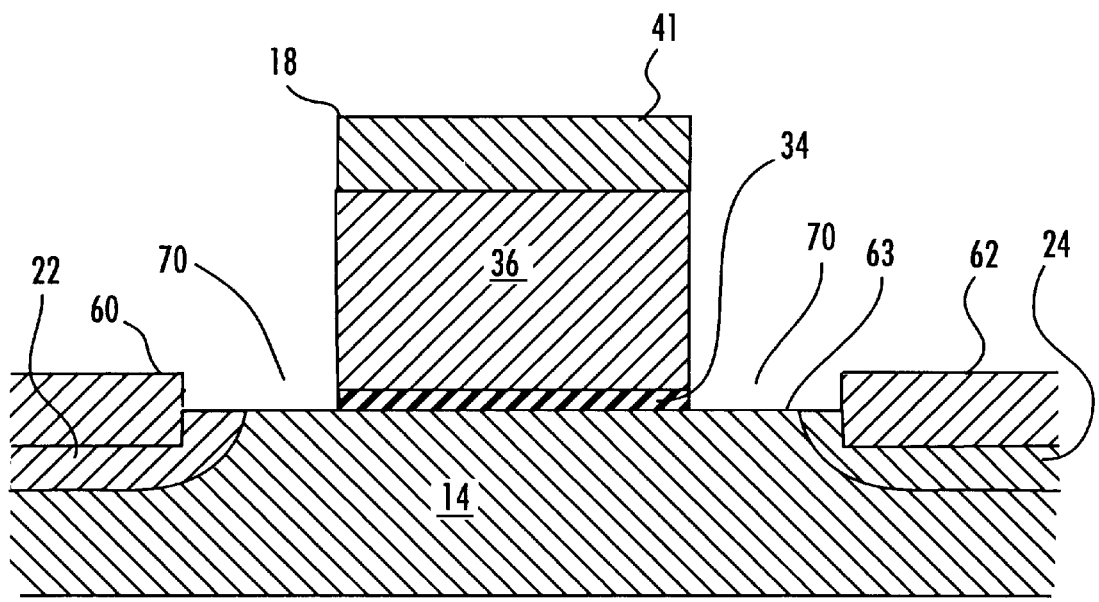
FIG. 4 is a cross-sectional view of the portion of the integrated circuit illustrated in FIG. 1, showing an etching step.

In FIG. 4, after layers 41, 60, and 62 are formed, spacers 39 are removed from portions of substrate 14 to leave gaps or openings 70. Gaps 70 are between layer 60 and structure 18 and between layer 62 and structure 18. Spacers 39 are a dummy material which can be removed by any removal process including a chemical wet-etching process, a dry etching process, or a plasma dry-etching process. Spacers 39 are preferably removed in a plasma dry etch process that is highly selective to silicon nitride. Layers 41, 60, and 62 protect substrate 14 and gate stack 18. Gaps 70 are preferably 500–800 Å wide.

Figure 5:
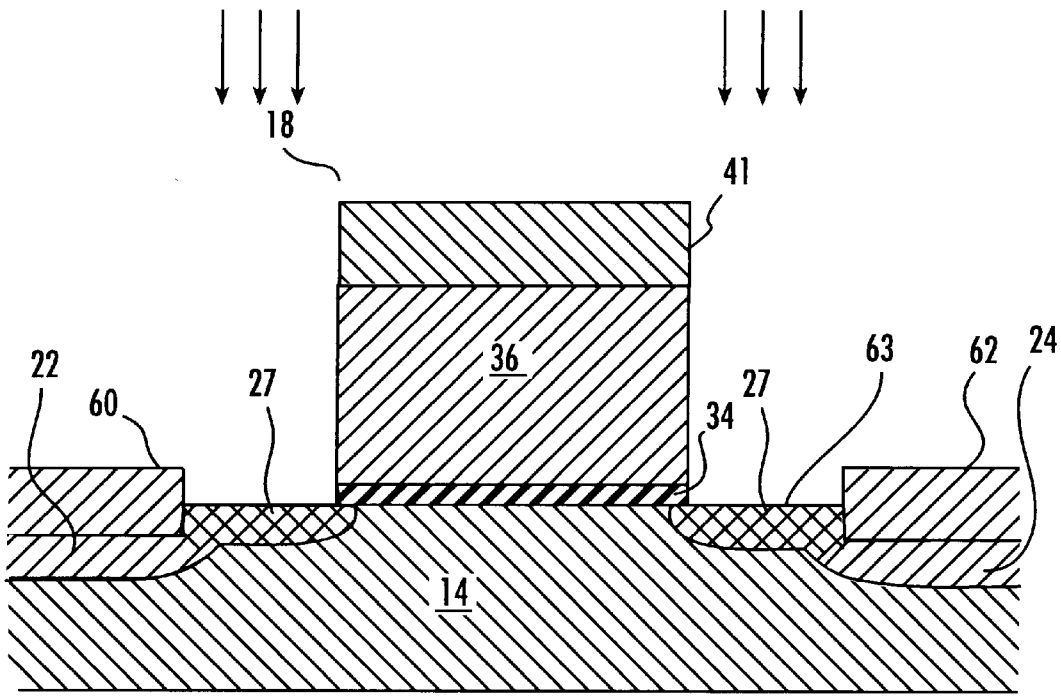
FIG. 5 is a cross-sectional view of the portion of the integrated circuit illustrated in FIG. 1, showing an ion implantation step.

An ion-implantation technique is utilized to form amorphization regions 27 in substrate 14, as shown in FIG. 5. Amorphization regions 27 (represented by X style cross-hatching in FIG. 5) are preferably formed through holes or gaps 70. Regions 27 are generally between 10–50 nm (preferably 20–40 nm) below top surface 63 of substrate 14. The ion-implantation technique provides germanium or silicon atoms at energy levels of 10–50 KeV with implantation devices manufactured by Varian Co. of Palo Alto, Calif.

With reference to FIG. 1, extensions 23 and 25 are formed by an ion-implantation process. After regions 27 are formed, a dopant that is the same as the dopant in regions 22 and 24 is deposited to form extensions 23 and 25 via low energy dopant implantation, where ions are charged up to 100–1000 electron volts (eVs). If boron is the dopant, the dopant is charged to 100–250 eV. If arsenic is the dopant, the dopant can be charged to as high as 2 KeV. Extensions 23 and 25 preferably have a thickness of less than 30 nm.

Insulative layer 46 is preferably silicon dioxide deposited in a tetraethylorthosilicate (TEOS) process at low temperature (<400° C.). Insulative layer 46 is approximately 1000–2000 Å thick. Vias on holes 50, 52 are etched into insulative layer 46 using a conventional etching technique.

Amorphization region 27 allows the dopant in extensions 23 and 25 to be activated at lower temperatures (<or equal to 600° C.). After layer 46 is provided, a conventional process can be utilized to complete transistor 12. For example, a conventional CMOS process can be utilized to form contacts and interconnects for transistor 12, as well as to fill holes 50 and 52 with a conductive contact.

It is understood that, while preferred embodiments, examples, materials, and values are given, they are for the purpose of illustration only. The apparatus and method of the invention are not limited to the precise details and conditions disclosed. For example, although plasma enhanced etching techniques are discussed, other methods could be utilized to remove structures. Thus, changes may be made to the details disclosed, without departing from the spirit of the invention, which is defined by the following claims.

What is claimed is:

1. A method of manufacturing an integrated circuit, comprising:
   providing a gate structure on a semiconductor substrate, the gate structure including a pair of sacrificial spacers, only one of the sacrificial spacers being on each side of the gate structure;
   providing a deep source region and a deep drain region, the gate structure being between the deep source region and the deep drain region, the deep source region and the deep drain region not including extensions;
   siliciding the deep source region, the deep drain region, and the gate structure;
   removing the sacrificial spacers from above a portion of the semiconductor substrate to leave a plurality of holes;
   forming an amorphous region through the holes within the portion of the semiconductor substrate and exclusive of the deep drain region and the deep source region, wherein the amorphous region is formed by ion implantation; and
   providing dopants to the amorphous region, thereby forming the extensions to the deep source region and the deep drain region.

2. The method of claim 1 further comprising:
   activating the dopants in annealing process at a temperature less than or equal to 600° C.

3. The method of claim 2, wherein the annealing process operates at less than 600° C.

4. The method of claim 3, wherein the removing step is a dry-etching step.

5. The method of claim 4, wherein the sacrificial spacers comprise nitride.

6. The method of claim 1 wherein the siliciding step includes providing titanium.

7. The method of claim 1, wherein the gate structure includes a polysilicon conductor.

8. The method of claim 1 further comprising:
   covering at least a portion of the semiconductor substrate with an insulative layer.

9. The method of claim 1, wherein the extensions have depths of less than 30 nm from a top surface of the semiconductor substrate.

10. The method of claim 9, wherein the amorphous region is approximately 20–40 nm deep.

11. A method of manufacturing an ultra-large scale integrated circuit including a plurality of field effect transistors having shallow source and drain extensions, the method comprising the steps of:
    providing at least part of a gate structure including a pair of dummy spacers on a top surface of a semiconductor substrate, the gate structure disposed between a deep source and a deep drain, the deep source and deep drain not including the shallow source and drain extensions, the gate structure including a single dummy spacer of the dummy spacers on each side of the gate structure;
    siliciding the deep source and the deep drain;
    removing the dummy spacers to form a first hole and a second hole;
    providing a silicon or germanium semiconductor implant through the first hole and through the second hole to amorphize the semiconductor substrate exclusive of the deep source and the deep drain; and
    then providing a dopant implant through the first hole and through the second hole to form the shallow source and drain extensions.

12. The method of claim 11, wherein the siliciding step includes nickel deposition.

13. The method of claim 12 further comprising:
    providing a silicon dioxide layer over the silicide.

14. The method of claim 11, wherein the step of providing a silicon or germanium semiconductor implant creates an amorphous silicon region.

15. The method of claim 11, further comprising:
    activating dopants associated with the dopant implant at a temperature of 600° C. or less.

16. The method of claim 15, wherein the dummy spacers are a silicon nitride material, the silicon nitride material being stripped in a dry-etching process.

17. A process for forming shallow source extensions and shallow drain extensions on a substrate, the process comprising:
    forming a plurality of gate structures on a top surface of the substrate, each gate structure including a single pair of spacers;
    forming deep source drain regions on each side of the gate structures, the deep source drain regions not including the shallow source extensions and the shallow drain extensions;
    siliciding the deep source drain regions;
    removing the single pair of spacers from each gate structure, thereby exposing the top surface of the substrate; and
    implanting silicon or germanium through the exposed top surface of the substrate to form amorphous silicon regions exclusive of the deep source drain regions in the substrate;
    then providing a dopant through the exposed top surface of the substrate to create the shallow source extensions and the shallow drain extensions.

18. The process of claim 17, further comprising:
    activating a dopant at a temperature 600° C. or below.

19. The process of claim 18, wherein the siliciding includes nickel.

20. The process of claim 19, wherein the energy of the implanting step less than 50 KeV.

* * * * *